United States Patent [19]

Barth

[11] Patent Number: 4,823,079
[45] Date of Patent: Apr. 18, 1989

[54] DEVICE FOR EQUIPPING AN ADAPTER WITH CONTACT PINS USED WITH A CIRCUIT BOARD TEST EQUIPMENT

[75] Inventor: Wolfram Barth, Pforzheim, Fed. Rep. of Germany

[73] Assignee: Siemens Aktiengesellschaft, Berlin and Munich, Fed. Rep. of Germany

[21] Appl. No.: 21,134

[22] Filed: Mar. 3, 1987

[30] Foreign Application Priority Data

Mar. 3, 1986 [DE] Fed. Rep. of Germany ....... 3606877

[51] Int. Cl.⁴ .......................................... G01R 1/073
[52] U.S. Cl. ............................ 324/158 F; 324/73 PC
[58] Field of Search ............ 324/158 F, 158 P, 73 PC

[56] References Cited

U.S. PATENT DOCUMENTS

| 4,535,536 | 8/1985 | Wyss | 324/158 F X |
| 4,686,467 | 8/1987 | DeLapp et al. | 324/158 F |
| 4,709,207 | 11/1987 | Larson | 324/158 F |

FOREIGN PATENT DOCUMENTS

| 0144682 | of 0000 | European Pat. Off. . |
| 0149776 | of 0000 | European Pat. Off. . |
| 0164722 | 12/1985 | European Pat. Off. . |
| 3033717 | 3/1982 | Fed. Rep. of Germany . |
| 3104227 | 8/1982 | Fed. Rep. of Germany . |
| 2920226 | 7/1983 | Fed. Rep. of Germany . |
| 3340184 | 5/1985 | Fed. Rep. of Germany ... 324/158 F |
| 3444708 | 6/1985 | Fed. Rep. of Germany ... 324/158 F |
| 2954194 | 7/1986 | Fed. Rep. of Germany . |
| 3507619 | 9/1986 | Fed. Rep. of Germany ... 324/158 F |
| 49270 | 3/1985 | Japan ............................. 324/158 F |
| 2086670 | 5/1982 | United Kingdom ............ 324/158 F |

Primary Examiner—Jerry Smith
Assistant Examiner—Stephen M. Baker
Attorney, Agent, or Firm—Kenyon & Kenyon

[57] ABSTRACT

For testing circuit boards at test points which are located on a raster and the minimum spacing of which is equal to twice the raster dimension, an intermediate adapter (ZA) is used which has a hole (ZAB) with a contact pin (ND2) per test point. Before the intermediate adapter (ZA) is equipped with the contact pins (ND2) the pins are inserted into magazine (MA) which has a cell (MAZ) with contact pins (ND1, ND2, ND3) being provided for each four adjacent raster points. A guiding plate (FP) is arranged between the adapter and the magazine. Guiding holes (FBR) which are arranged on top of the holes (ZAB) of the intermediate adapter are contained in the guiding plate (FP) which are arranged on top of the holes (ZAB) of the intermediate adapter and direct the contact pins (NB2) falling from the magazine (MA) into the holes (ZAB) of the intermediate adapter.

8 Claims, 2 Drawing Sheets

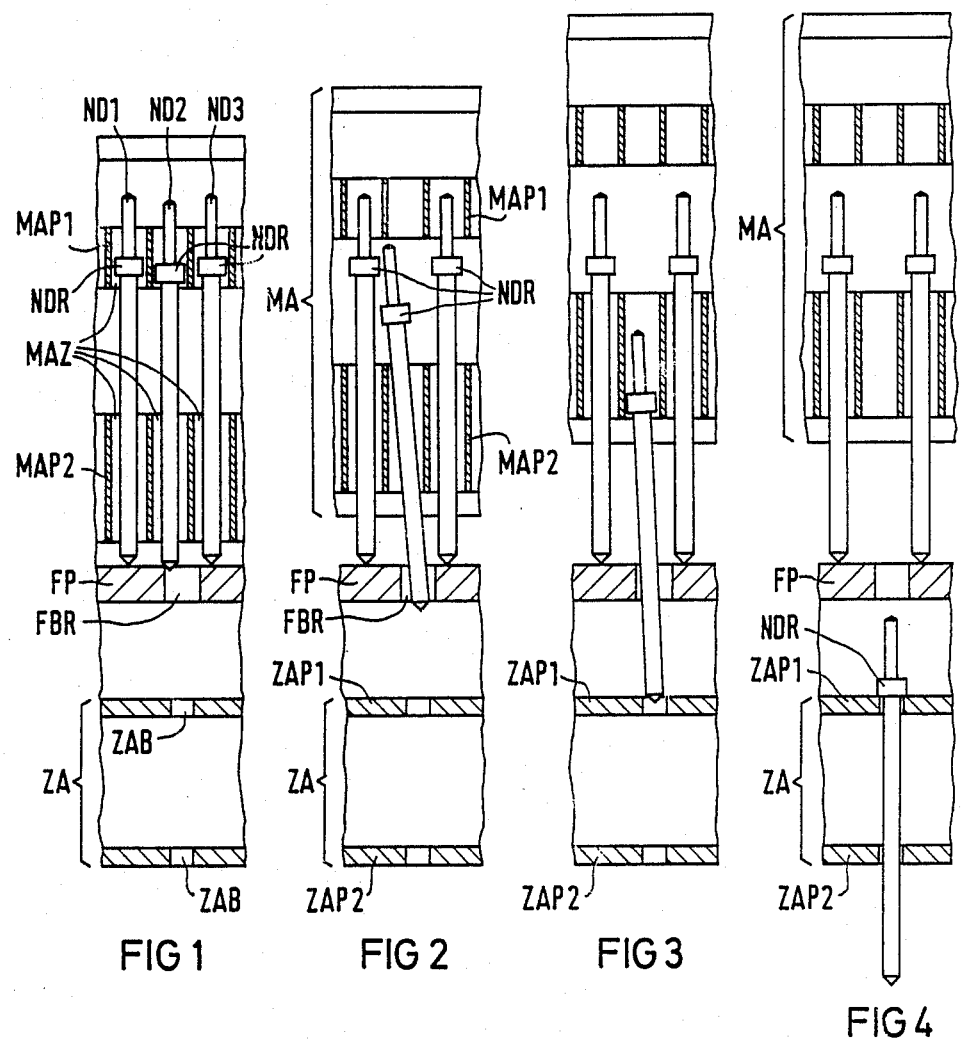

DEVICE FOR EQUIPPING AN ADAPTER WITH CONTACT PINS USED WITH A CIRCUIT BOARD TEST EQUIPMENT

BACKGROUND OF THE INVENTION a. Field of Invention

This invention relates to an adapter for testing circuit boards with a raster of test points, and more particularly for a device with a holder housing a plurality of contact pins for selectively engaging said point.

b. Description of the Prior Art

A device is known from German Patent 29 20 226 which is suitable for equipping intermediate adapters with contact pins disposed in a magazine for testing circuit boards having testing points which are arranged in a raster at a distance equal to the raster dimension. In this known device, holes for receiving components are likewise arranged in a raster but their minimum spacing is larger and generally equal to twice the raster dimension, and therefore for practical purposes, the device is not suitable for boards with different raster dimensions since the magazine would have to have a cell with a contact pin for every possible test point, even though only one of four adjacent possible test points may have to be contacted by a test pin. In addition, difficulties would be encountered in the manufacture and handling of the adapter because of the close raster.

SUMMARY OF THE INVENTION

It is an object of the present invention to provide a device with contact pins coupled to an intermediate adapter for testing boards and flat subassemblies, the actual test points of which have a minimum spacing which is larger than the raster dimension of all the possible test points.

An intermediate adapter, the guiding plate and a pin magazine are assembled and are then turned by 180° so that the contact pins can drop from the magazine into the intermediate adapter. Subsequently the magazine is lifted, advantageously while being vibrated. After testing, the contact pins are returned from the intermediate adapter to the magazine.

BRIEF DESCRIPTION OF THE FIGURES

FIG. 1 shows in a side sectional view the elements of the invention in a starting configuration;

FIGS. 2-4 show the progressively the contact pins being dropped from the magazine through the adapter plate.

DETAILED DESCRIPTION OF THE INVENTION

Figure 5:
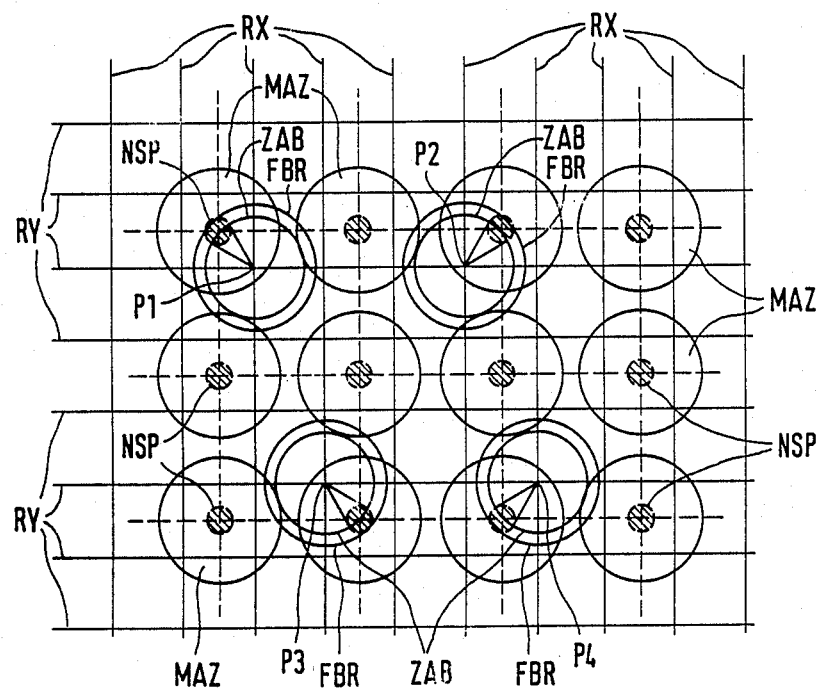
FIG. 5 shows a plan view of printed circuit board with a raster and test points and with a superimposed device constructed in accordance with the invention.

FIG. 1 shows in cross section a portion of a contact pin magazine MA, a guiding plate FP and an intermediate adapter ZA. The magazine MA has a plurality of cells MAZ, each of which contains corresponding contact pin ND1, ND2, ND3. The intermediate adapter ZA is provided with holes ZAB for passing contact pins from the magazine as described below. After the magazine is coupled to the intermediate adapter, the intermediate adapter ZA is secured to a test device for circuit boards which test device contacts the board through the contact pins at certain predetermined test points. These test points are arranged on a raster like the raster holes or points for receiving components. However, not every raster point (or hole) is used as a test point; the test points rather have a minimum spacing which is at least equal to twice the raster pitch. This means that of a quadruple group of four adjacent raster points, only one can be a test point. Accordingly, only one cell with a corresponding pin is provided in the magazine for each such quadruple group. Thereby, the magazine is designed large enough so that different intermediate adapters for testing corresponding circuit boards with differently distributed test points can be equipped completely.

A guiding plate FP provided with guiding holes FBR serves to direct the contact pins dropping from the cells of the magazine into the holes ZAB of the intermediate adapter ZA and to hold the remaining pins in the cells of the magazine. The magazine MA and the intermediate adapter ZA are also equipped with upper and lower holes MAP1, MAP2 and ZAP1, ZAP2, respectively.

In FIG. 5, the relative positions of the magazine, the guiding holes FBR of the guiding plate, the holes ZBA of the intermediate adapter and the circuit board are illustrated in a superimposed configuration. RX, RY are used to designate raster lines, on the circuit board the intersections of which define raster points. Some of the raster points are test points so that the spacing of two test points, is at least equal to twice the spacing of two raster lines in the X or Y direction. This means, for instance, for a test point P1 that no test point is located at the adjacent eight raster points. Starting out from this idea, one magazine cell MAZ is assigned to a quadruple of raster points each. The position and diameter of the cells are chosen so that the centers of the cells MAZ, i.e., the tips NSP of the contact pins shown by shaded small circles are located initially, at a position equidistant from the four adjacent raster points and the cell covers the four raster points as shown. The test points P1, P2, P3, P4 coincide with the centers of the guiding holes FBR and the holes ZAB of the intermediate adapter, the guiding holes FBR having a diameter larger than the holes ZAB. The guide holes must be large enough so that the tips NSP of the contact pins can penetrate into the holes from the magazine cells on top thereof. The contact pins require, in addition, more play in the guiding holes than in the holes of the intermediate adapter, where they must be seated as far as possible without play. The coincident position of the holes FBR and ZAB has the advantage that they can drilled simultaneously by automated or programmed equipment. It is even possible to use, at least partially, the same drilling program used to make the circuit board to be tested.

In the following, the insertion operation will be described in greater detail, referring to FIGS. 1 to 4. The magazine MA housing the contact pins is connected to the guiding plate FP and the intermediate adapter ZA, with guide pins (not shown) being used to assure exact mutual positioning, the adapter being positioned above the magazine. Thereupon, the entire arrangement is rotated 180° so that the points of the pins ND1, ND2, ND3 point downward as shown in FIG. 1. The pins ND1, ND3 for the cells which do not correspond to a test point at the four raster points associated with them, drop only to the guiding plate FP, and their tips rest thereon. Where a test point is provided, one of the pins, for instance ND2, drops into the guide holes FBR but cannot yet fall therethrough. When the magazine MA is lifted and the pins passing through hole FBR are allowed to slide from the cells down far enough so that a ring NDR provided in the upper part is released from hole MAP 1. The pins are given enough horizontal play that they are inclined laterally and can fall into the guiding holes FBR as shown in FIG. 2. From this position they are directed into holes in the upper plate ZAP1 of the intermediate adapter ZA and, finally, drop vertically into the holes of the lower magazine plate ZAP2 with the rings NDR engaging the upper adapter plate ZAP1. Then, the magazine MA and the guiding FB can be taken off the intermediate adapter ZA and a contact plate (not shown) establishing electrical connections between the pins and the test equipment can be installed. The intermediate adapter ZA can then be inserted into a device for testing circuit boards, the intermediate adapter and the circuit boards being positioned exactly relative to each other by pins, so that the points of the contact pins touch the circuit board at the intended test points.

Cells (MAZ) may have a circular cross section with a diameter which is smaller preferably by 10 to 20% than twice the minimum distance between raster points. Similarly, the diameter of guide holes (FBR) is somewhat smaller and preferably 10% smaller than twice the minimum distance between test points. The diameter of intermediate adapter holes (ZAB) is smaller than the diameter of the guide holes (FBR) and the cells (MAZ) but at least equal to the minimum spacing between the test points.

Obviously, numerous modification may be made to the invention without departing from its scope as defined in the appended claims.

What is claimed is:

1. A device for equipping an adapter with contact pins for connecting test equipment to a circuit board having a plurality of raster points, some of said raster points being designated as test points for testing said circuit board, wherein the minimum spacing of the test points is equal to at least twice the raster dimension, comprising:

a contact pin magazine (MA), in which contact pins are stored in cells (MAZ) arranged in grating fashion, contact pins (ND1, ND2, ND3) being provided for every test point with the center distance between the cells (MAZ) being equal to said minimum spacing of said test points;

a plate-shaped intermediate adapter (ZA), onto one side of which the circuit board can be mounted, said adapter having adapter holes (ZAB)1 passing vertically through said adapter, said holes being provided to pass at least one pin (ND2) from said magazine, said adapter being constructed and arranged so that, with the circuit board in place, said one contact pin touches the circuit board at one of said test points; and a guide plate (FP) provided for inserting the contact pins (ND1, ND2, ND3), said guide plate having guide holes (FBR) distributed in a pattern matching said test points, said plate being arranged on said intermediate adapter (ZA) and said magazine (MA) being arranged on top of said plate;

wherein cells (MAZ) of said magazine (MA) being constructed with said contact pins (ND1, ND2, ND3) having lateral play when they drop toward said guide plate (FP), wherein each cell is arranged with its central axis always pointing towards center of four raster points; the guide holes (FBR) of the guiding plate (FP) being large enough to enclose the axis of the corresponding cell (MAZ) of the magazine and to direct the tips (NSP) of the contact pins falling from the cells and guiding holes (FBN) through the adapter holes (ZAB)

2. The device according to claim 1 wherein said intermediate adapter (ZA) consists of two plates (ZAP1, ZAP2) mounted at preselected spacing from each other.

3. The device according to claim 1 wherein said magazine (MA) consists of two plates (MAP1, MAP2) mounted at a preselected distance from each other and the diameter of the holes in the lower plate (MAP2) is large enough to provide lateral play for said pins (ND1, ND2, ND3) after said pins drop out of the upper plate (MAP1).

4. The device according to claim 1 wherein said magazine cells (MAZ) have a circular cross section with a diameter which is 10 to 20% smaller than twice the minimum distance of the test points.

5. The device according to claim 1 wherein the diameter of the guide holes (FBR) is about 10% smaller than twice the minimum distance of test points.

6. The device according to claim 1 wherein the diameter of the intermediate adapter holes (ZAB) is smaller than that of the guide holes (FBR) and that of the cells (MAZ) of the magazine, but at least equal to the minimum spacing of the test points.

7. The device according to claim 1 wherein said magazine (MA) is movable relative to the guiding plate (FP) and the intermediate adapter (ZA).

8. The device according to claim 1 wherein said guiding plate (FP) is movable relative to the intermediate adapter (ZA).

* * * * *